US012626747B2

(12) United States Patent (10) Patent No.: US 12,626,747 B2
Park et al. (45) Date of Patent: May 12, 2026

(54) SEMICONDUCTOR MEMORY DEVICE SELECTIVELY PERFORMING SELF-REFRESH OPERATION AND SELF-REFRESH METHOD THEREOF

(71) Applicant: SAMSUNG ELECTRONICS CO., LTD., Suwon-si (KR)

(72) Inventors: Youngjae Park, Suwon-si (KR); Soomin Kim, Suwon-si (KR); Yuchan Kim, Suwon-si (KR); Dongha Kim, Suwon-si (KR); Hyunbo Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 62 days.

(21) Appl. No.: 18/588,739

(22) Filed: Feb. 27, 2024

(65) Prior Publication Data

US 2025/0069637 A1 Feb. 27, 2025

(30) Foreign Application Priority Data

Aug. 23, 2023 (KR) ........................ 10-2023-0110775

(51) Int. Cl.
*G11C 11/406* (2006.01)
*G11C 11/4076* (2006.01)
(52) U.S. Cl.
CPC .. *G11C 11/40615* (2013.01); *G11C 11/40618* (2013.01); *G11C 11/4076* (2013.01)
(58) Field of Classification Search
CPC ............................................. G11C 11/40615
See application file for complete search history.

(56) References Cited

U.S. PATENT DOCUMENTS

| | | | |
|---|---|---|---|
| 5,640,357 A | * | 6/1997 | Kakimi ................ G11C 11/406 365/222 |
| 5,812,475 A | | 9/1998 | Lee et al. |
| 7,394,712 B2 | | 7/2008 | Do |
| 7,423,456 B2 | | 9/2008 | Gomm et al. |
| 7,613,064 B1 | | 11/2009 | Wagner et al. |
| 8,374,047 B2 | | 2/2013 | Oh |
| 8,441,864 B2 | | 5/2013 | Hong |
| 2017/0062038 A1 | * | 3/2017 | Doo .................. G11C 11/40603 |
| 2021/0012831 A1 | | 1/2021 | Oh et al. |

FOREIGN PATENT DOCUMENTS

KR          10-0197562 B1      6/1999

OTHER PUBLICATIONS

EPO Search Report cited in related EP Patent Application 24185355. 5, dated Nov. 29, 2024. 10 pages.

* cited by examiner

*Primary Examiner* — Hoai V Ho
(74) *Attorney, Agent, or Firm* — Morgan, Lewis & Bockius LLP

(57) ABSTRACT

A self-refresh method of a semiconductor memory device includes: receiving a self-refresh entry command associated with a self-refresh operation; counting an elapsed time from a time of receiving the self-refresh entry command; and skipping the self-refresh operation depending on whether a self-refresh exit command is received before the counted elapsed time exceeds a reference time.

18 Claims, 15 Drawing Sheets

OSC cycle

1285

Oscillator iCLK

1287

Counter

SRE

SRX

SR_Master

FIG. 9

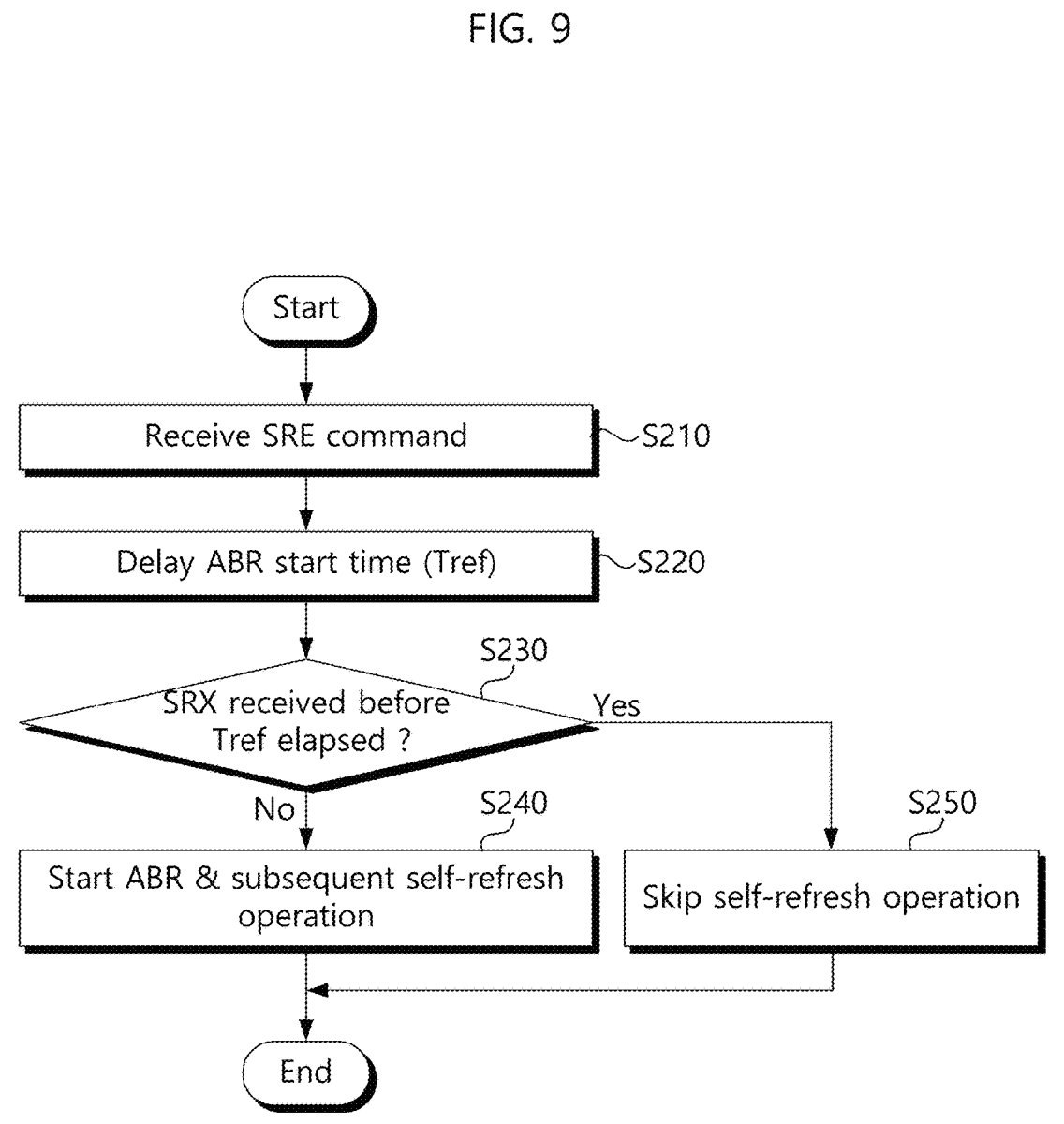

Start

Receive SRE command ~S210

Delay ABR start time (Tref) ~S220

SRX received before Tref elapsed ? ~S230

Yes → Skip self-refresh operation ~S250

No → Start ABR & subsequent self-refresh operation ~S240

End

FIG. 11

* Tref = α x tREFi
(0.5 ≤ α ≤ 1)

FIG. 15

SEMICONDUCTOR MEMORY DEVICE SELECTIVELY PERFORMING SELF-REFRESH OPERATION AND SELF-REFRESH METHOD THEREOF

CROSS-REFERENCE TO RELATED APPLICATIONS

This patent application claims priority under 35 U.S.C. § 119 to Korean Patent Application No. 10-2023-0110775 filed on Aug. 23, 2023, in the Korean Intellectual Property Office, the disclosure of which is incorporated by reference in its entirety herein.

1. Technical Field

Embodiments of the present disclosure described herein are directed to a semiconductor memory device, and more specifically, to a semiconductor memory device that selectively performs a self-refresh operation and a self-refresh method thereof.

2. Discussion of Related Art

The semiconductor memory device may be voltage memory such as a dynamic random access memory (DRAM) device, which stores data using charges stored in a capacitor. However, the DRAM device has finite data retention characteristics since the charges stored in the capacitor can leak through various paths over time. Accordingly, the DRAM device uses a refresh operation that periodically rewrites data stored in the capacitor.

The refresh of the DRAM device may be performed using DRAM self-refresh commands. For example, a self-refresh of the DRAM device may start in response to a self-refresh entry command and stop in response to a self-refresh exit command. The time between the self-refresh entry command and the self-refresh exit command is defined as the duration of the self-refresh operation. In certain operations, the DRAM self-refresh command may occur unnecessarily. For example, self-refresh entry commands and self-refresh exit commands may be provided frequently without consideration of the duration. A logic error may occur when the self-refresh is forcibly performed repeatedly in situations where self-refresh is not necessary.

SUMMARY

At least one embodiment of the present disclosure provides a semiconductor memory device that can autonomously perform a self-refresh operation in response to an externally input self-refresh command by considering a self-refresh duration time and a self-refresh method thereof.

According to an embodiment, a self-refresh method of a semiconductor memory device includes: receiving a self-refresh entry command associated with a self-refresh operation; counting an elapsed time from a time of receiving the self-refresh entry command; and skipping the self-refresh operation depending on whether a self-refresh exit command is received before the counted elapsed time exceeds a reference time.

According to an embodiment, a semiconductor memory device includes a cell array, a command decoder, a control circuit, and a refresh controller. The cell array includes a plurality of dynamic-random-access-memory (DRAM) cells. The command decoder is configured to decode a command associated with a self-refresh operation to generate a self-refresh entry command and a self-refresh exit command. The control circuit is configured to generate a control signal to skip the self-refresh operation when a time difference between a reception time of the self-refresh entry command and a reception time of the self-refresh exit command is shorter than a reference time. The refresh controller is configured to perform one of i) the self-refresh operation on a selected memory area of the cell array and ii) the skip of the self-refresh operation, in response to the control signal.

According to an embodiment, a self-refresh method of a semiconductor memory device includes: receiving a self-refresh entry command associated with a self-refresh operation; delaying the self-refresh operation by a reference time in response to the self-refresh entry command; detecting whether a self-refresh exit command is input before an elapsed time from receipt of the self-refresh entry command reaches the reference time; and skipping the self-refresh operation when the self-refresh exit command is received before the elapsed time reaches the reference time.

BRIEF DESCRIPTION OF THE FIGURES

FIG. 2 is a block diagram showing a memory device according to an embodiment of the present invention.

FIG. 5 is a block diagram showing a duration detector of FIG. 3 according to an embodiment of the present invention.

FIG. 9 is a flowchart showing a method of operating the self-refresh skip circuit according to an embodiment of the present invention.

FIG. 11 is a timing diagram showing an example operation of the self-refresh skip circuit.

FIG. 15 is a block diagram showing an example of applying a memory device including the self-refresh skip circuit to a computing system according to an embodiment of the present invention.

DETAILED DESCRIPTION

The present disclosure will now be described more fully hereinafter with reference to the accompanying drawings, in which example embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art. The same reference numbers are used in the description and drawings to refer to the same or like parts.

Hereinafter, a DRAM device will be used as an example of a semiconductor memory device to explain the features and functions of the present invention. However, the semiconductor memory device is not limited thereto. In addition, the term 'Duration' used in this specification refers to the time between a self-refresh entry command SRE and a self-refresh exit command SRX.

Figure 1:
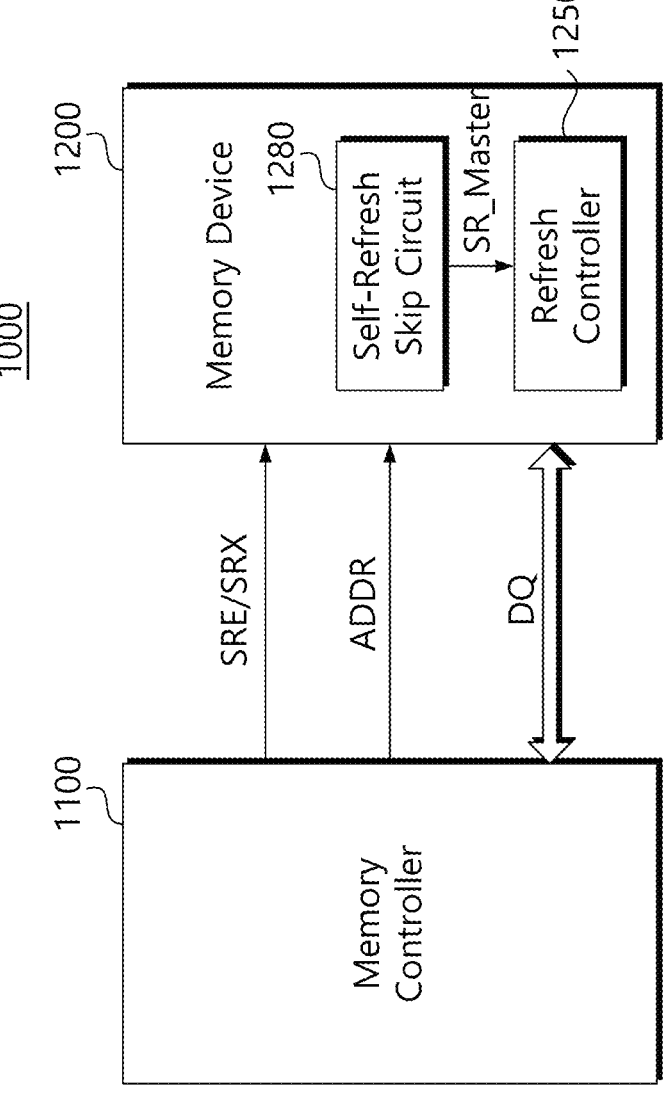
FIG. 1 is a block diagram showing a memory system including a memory device according to an embodiment of the present invention.

FIG. 1 is a block diagram showing a memory system including a memory device according to an embodiment of the present invention. Referring to FIG. 1, the memory system 1000 may include a memory controller 1100 (e.g., a control circuit) and a memory device 1200.

The memory controller 1100 may perform an access operation to write data to the memory device 1200 or read data stored in the memory device 1200. Data exchange between the memory controller 1100 and the memory device 1200 occurs through a data channel DQ. The memory controller 1100 may generate a command CMD and an address ADDR for writing data to the memory device 1200 or reading data stored in the memory device 1200. The memory controller 1100 may be at least one of a memory controller for controlling the memory device 1200, a system-on-chip SoC such as an application processor (AP), a central processing unit (CPU), or a graphical processing unit (GPU).

The memory controller 1100 may issue refresh commands to control a refresh operation in the memory device 1200. Examples of the refresh commands include an all bank refresh ABR command and a per-bank refresh PBR command. In an embodiment, the ABR command causes all banks of a portion of the memory device 1200 to be refreshed simultaneously. In an embodiment, the per-bank refresh PBR command causes refresh of an individual bank of the memory device 1200. In addition, the memory controller 1100 may provide commands (SRE, SRX) to control a self-refresh operation to the memory device 1200. The self-refresh entry SRE command is a command that instructs the start of a self-refresh operation, and the self-refresh exit SRX command is a command that instructs the end of a self-refresh operation that has already been entered.

In an embodiment, the all-bank refresh ABR command is a command to refresh all banks for a selected cell-row of memory cells of the memory device 1200. In an embodiment, when a refresh operation occurs in all memory banks, a read or write command to the memory banks being refreshed cannot be provided after an ABR command is provided. In some embodiments, when the SRE command is provided, an all-bank refresh ABR operation may be automatically initiated. When the per-bank refresh PBR command is provided with an address that specifies one bank, reading and writing to an unselected bank is possible.

The memory controller 1100 does not consider duration, which is the time difference between the self-refresh entry command SRE and the self-refresh exit command SRX, for the self-refresh operation. In other words, an operation of issuing the self-refresh exit command SRX immediately after issuing the self-refresh entry command SRE may be repeated. In this case, the memory device 1200 may need to terminate immediately after starting the self-refresh operation. That is, the refresh operation may need to be terminated before a refresh period tREFi required for refreshing the selected row elapses. If this operation occurs frequently, logic errors or a performance degradation may occur.

The memory device 1200 outputs read data requested by the memory controller 1100 to the memory controller 1100 or stores data requested to be written by the memory controller 1100 in a memory cell. In an embodiment, the memory device 1200 is configured to detect or determine whether a self-refresh command has a short duration (e.g., a duration less than a threshold). Depending on the detection result, the self-refresh operation may be internally skipped. That is, the memory device 1200 can detect when the duration between the self-refresh entry command SRE and the self-refresh exit command SRX is short or less than a threshold. When the self-refresh command with a short duration is detected, the self-refresh operation can be omitted. This function will be referred to as 'self-refresh skip'. For example, a previous set of SRE and SRX commands received with a short duration therebetween may be ignored in certain cases.

The memory device 1200 includes a self-refresh skip circuit 1280 and a refresh controller 1250 (e.g., a controller circuit) for the self-refresh skip. When a self-refresh entry command SRE is received, the self-refresh skip circuit 1280 delays the start of the self-refresh operation by a specific delay time. In an embodiment, the self-refresh skip circuit 1280 determines a self-refresh skip according to a reception time (e.g., a point in time) of the subsequent self-refresh exit command SRX. For example, the self-refresh skip circuit 1280 is configured to skip the delayed self-refresh operation when the self-refresh exit command SRX is received before the reference time Tref from the time of receiving the self-refresh entry command SRE. In an embodiment, the self-refresh skip circuit 1280 starts the delayed self-refresh operation when the subsequent self-refresh exit command SRX is received after the reference time Tref from the time of receiving the self-refresh entry command SRE. For example, the self-refresh skip circuit 1280 may immediately start the delayed self-refresh operation when the subsequent self-refresh exit command SRX is received after the reference time Tref from the time of receiving the self-refresh entry command SRE. In an embodiment, the reference time Tref is set to be shorter than the refresh period tREFi. To set the reference time Tref, the self-refresh skip circuit 1280 may further include a lookup table LUT set through a mode register set MRS command. For example, the self-refresh skip circuit 1280 may refer to the lookup table LUT to determine the reference time Tref.

The refresh controller 1250 performs self-refresh operations on memory cells according to the control signal SR_Master generated by the self-refresh skip circuit 1280. In other words, the refresh controller 1250 can activate or control the word lines of memory cells to start and end the self-refresh operation according to the control signal SR_Master.

Here, the memory device 1200 may be a high bandwidth memory (HBM) or a next-generation DRAM (e.g., LPDDR6 or LPDDR7) that operates at ultra-speed. The memory device 1200 may be a semiconductor memory device within a system-in-package (SiP). Alternatively, the memory device 1200 may include a volatile memory device such as Double Data Rate Synchronous Dynamic Random Access Memory (DDR SDRAM), Low Power Double Data Rate (LPDDR) SDRAM, Graphics Double Data Rate (GDDR) SDRAM, Rambus Dynamic Random Access Memory (RDRAM), and static random access memory (SRAM). Alternatively, the memory device 1200 can be a non-volatile memory device such as resistive RAM (RRAM), phase change memory (PRAM), magnetoresistive memory (MRAM), ferroelectric memory (FRAM), and spin injection magnetization reversal memory (STT-RAM). In this specification, the present invention is described based on DRAM, but the technical idea of the present disclosure is not limited thereto.

As described above, unnecessary self-refresh operations can be omitted or skipped according to the self-refresh skip operation that is autonomously performed in the memory device 1200 according to an embodiment of the present invention. Accordingly, logic errors or power consumption within the memory device 1200 that occur due to unnecessary self-refresh operations can be reduced.

Figure 2:
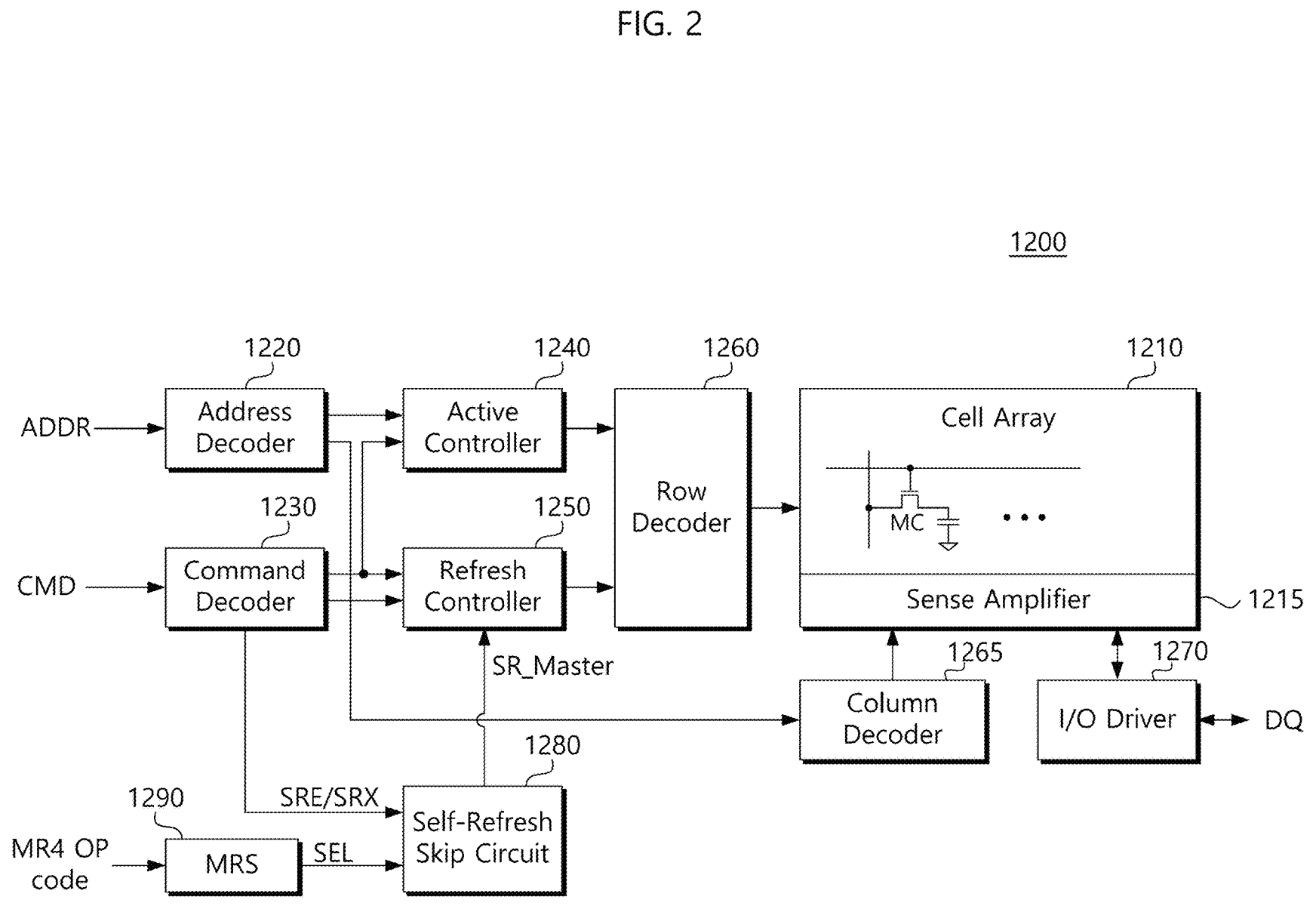

FIG. 2 is a block diagram showing a memory device according to an embodiment of the present invention. Referring to FIG. 2, the memory device 1200 includes a cell array 1210, a sense amplifier 1215, an address decoder 1220 (e.g., a first decoder circuit), a command decoder 1230 (e.g., a second decoder circuit), an active controller 1240 (e.g., first a controller circuit), a refresh controller 1250 (e.g., a second controller circuit), and a row decoder 1260 (e.g., a third decoder circuit), a column decoder 1265 (e.g., a fourth decoder circuit), an input/output driver 1270 (e.g., a driver circuit), a self-refresh skip circuit 1280, and a mode register set 1290.

The cell array 1210 includes a plurality of memory cells MC. Data stored in the memory cells MC may be provided to the input/output driver 1270 through the sense amplifier 1215. Alternatively, write data received from the input/output driver 1270 may be stored in a selected memory cell through the sense amplifier 1215. The column decoder 1265 and the row decoder 1260 may select a memory cell corresponding to the address ADDR.

The address decoder 1220 receives the address ADDR of the memory cell to be accessed. When data is stored in the cell array 1210 or data is read from the cell array 1210, the address ADDR is received and decoded in the address decoder 1220 to generate a decoded address. The decoded address may be delivered to the active controller 1240, row decoder 1260, and column decoder 1265. The row decoder 1260 and column decoder 1265 select the row and column specified by the address ADDR.

The command decoder 1230 receives various commands input through a command/address line. The command decoder 1230 decodes commands and may provide the decoded commands to circuit blocks such as the column decoder 1265, the active controller 1240, and the refresh controller 1250. The command decoder 1230 may determine the input command by referring to externally applied signals such as /RAS, /CAS and /WE. Alternatively, the command decoder 1230 may write data to a mode register set (MRS, not shown) according to an externally provided command and address. For example, a general auto refresh operation may be input through a combination of control signals /RAS, /CAS and /WE. Then, the refresh operation will be determined by the command decoder 1230, and the command decoder 1230 will provide a corresponding refresh command to the refresh controller 1250. In an embodiment, the command decoder 1230 transmits a self-refresh entry command SRE and a subsequent self-refresh exit command SRX to the self-refresh skip circuit 1280 according to the decoding result of the input command.

In an embodiment, the active controller 1240 generates an active address and an active signal according to the address ADDR and command CMD provided from the address decoder 1220 and the command decoder 1230, and then the active controller 1240 provides the active address and the active signal to the row decoder 1260.

When a refresh command is input to the memory device 1200, the refresh controller 1250 performs a refresh operation corresponding to the refresh command. For example, when an All-Bank Refresh ABR command is received, the refresh controller 1250 simultaneously refreshes all memory banks corresponding to the selected row. When a per-bank refresh PBR command is received, the refresh controller 1250 will perform a refresh operation on a single bank selected through a bank address among a plurality of memory banks.

In an embodiment, the refresh controller 1250 generates an internal address for refresh of a selected memory unit during a self-refresh operation and performs a refresh operation on memory cells selected by the internal address. During the self-refresh operation, the refresh controller 1250 may delay the self-refresh operation for the selected memory unit according to the control signal SR_Master provided from the self-refresh skip circuit 1280. Alternatively, the refresh controller 1250 may start or skip the self-refresh operation for the selected memory unit according to the control signal SR_Master provided from the self-refresh skip circuit 1280.

The row decoder 1260 controls the operation of the cell array 1210 through the provided active address, active signal, refresh active signal, and refresh address. During a self-refresh cycle, the row decoder 1260 activates the cell-row selected by the refresh controller 1250. The row decoder 1260 will activate the cell-row of the selected bank during the self-refresh operation.

The input/output driver 1270 may receive data provided through a data pad DQ and provide it to the sense amplifier 1215. The input/output driver 1270 may output data stored in the cell array 1210 through the data pad DQ. The input/output driver 1270 may receive a data strobe signal DQS when receiving data. Additionally, the input/output driver 1270 may output data using the data strobe signal DQS.

Upon receiving a self-refresh entry command (SRE) from the command decoder 1230, the self-refresh skip circuit 1280 delays the start of self-refresh operation by a specific delay time. The self-refresh skip circuit 1280 may generate a control signal SR_Master to skip or omit the delayed self-refresh operation when the subsequent self-refresh exit command SRX is received before the reference time Tref from the time of receiving the self-refresh entry command SRE. In an embodiment, the self-refresh skip circuit 1280 immediately performs the delayed self-refresh operation if the subsequent SRX command is not received even while the reference time Tref has elapsed since receiving the self-refresh entry command SRE. In an embodiment, the reference time Tref is set shorter than the refresh period tREFi. To set the reference time Tref, the self-refresh skip circuit 1280 may further include a lookup table LUT set by a selection signal SEL provided from the mode register set 1290.

The mode register set 1290 sets internal mode registers in response to an MRS command and an address ADDR for specifying the operation mode of the memory device 1200. The mode register set 1290 according to an embodiment of the present invention may include registers for setting the length of the reference time Tref of the self-refresh skip circuit 1280. Alternatively, the mode register set 1290 may include a separate test mode register set TMRS for setting the reference time Tref of the self-refresh skip circuit 1280.

The mode register set 1290 can generate the selection signal SEL for setting the length of the reference time Tref in an embodiment of the present invention by an externally provided setting command (e.g., MR4 OP code).

Above, an exemplary structure of the memory device 1200 of the present invention has been described. The memory device 1200 according to an embodiment of the present invention is internally set to skip the self-refresh operation in the case of self-refresh commands (SRE to SRX) with a short duration. Accordingly, the memory device 1200 can block or ignore execution of unnecessary self-refresh operations. In addition, the memory device 1200 can reduce logic errors and power consumption due to unnecessary self-refresh operations.

Figure 3:
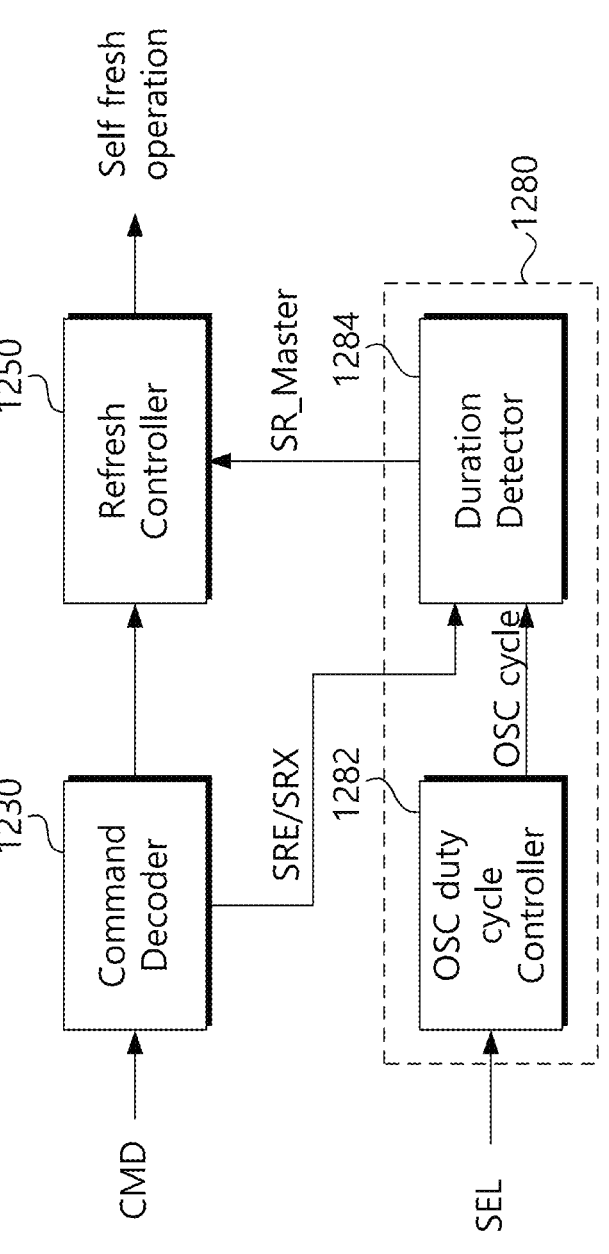
FIG. 3 is a block diagram showing an operation of a self-refresh skip circuit of the memory device according to an embodiment of the present invention.

FIG. 3 is a block diagram showing an operation of the self-refresh skip circuit according to an embodiment of the present invention. Referring to FIG. 3, the self-refresh skip circuit 1280 includes an oscillator duty cycle controller 1282 (e.g., a controller circuit) and a duration detector 1284 (e.g., a detector circuit). Here, the command decoder 1230 and the refresh controller 1250 are the same as those in FIG. 2, so their description will be omitted.

The oscillator duty cycle controller 1282 sets the length of the duration by, for example, an MRS command (e.g., MR4 OP code). In other words, the oscillator duty cycle controller 1282 can set the length of the interval between the self-refresh entry command SRE and the self-refresh exit command SRX corresponding to the skip condition of the self-refresh operation, that is, the 'duration'. The duration detector 1284 can determine whether the length of the duration has exceeded the reference time Tref based on the oscillator cycle 'OSC cycle' selected by the MRS command (MR4 OP code).

The duration detector 1284 determines the period of the oscillator according to the period defined by the oscillator cycle. For example, if the oscillator cycle 'OSC cycle' is set to 0.6 times the refresh cycle tREFi of the memory device 1200, then the reference time Tref for determining whether to skip the self-refresh operation is set to '0.6xtREFi' corresponding to 1 cycle of the oscillator cycle 'OSC cycle'. If the self-refresh exit command SRX is not input while the reference time Tref corresponding to 1 cycle (0.6xtREFi) elapses after the self-refresh entry command SRE is received, the duration detector 1284 generates a control signal SR_Master to actually proceed with the self-refresh operation when the self-refresh exit command SRX is not received while '0.6xtREFi' elapses after receiving the SRE command. However, the self-refresh exit command SRX may be received before the reference time Tref of '0.6xtREFi' elapses after the self-refresh entry command SRE is provided, and then the duration detector 1284 may generate a control signal SR_Master to skip or omit the self-refresh operation.

In an embodiment, the duration detector 1284 operates to prevent skipping of the self-refresh operation more than a certain number of times when the self-refresh operation is continuously skipped. That is, an event in which the self-refresh exit command SRX is provided may occur continuously before the reference time Tref elapses after the self-refresh entry command SRE is received. In this case, the self-refresh operation may be continuously skipped. Therefore, when the skip event of the self-refresh operation based on the reference time Tref occurs continuously more than the reference number of times, the duration detector 1284 may generate a control signal SR_Master to forcibly start the self-refresh operation. For example, if too many pairs of SRE and SRX commands are received before the reference time Tref elapses, this event may be interpreted as requiring performing of the self-refresh operation.

Figure 4:
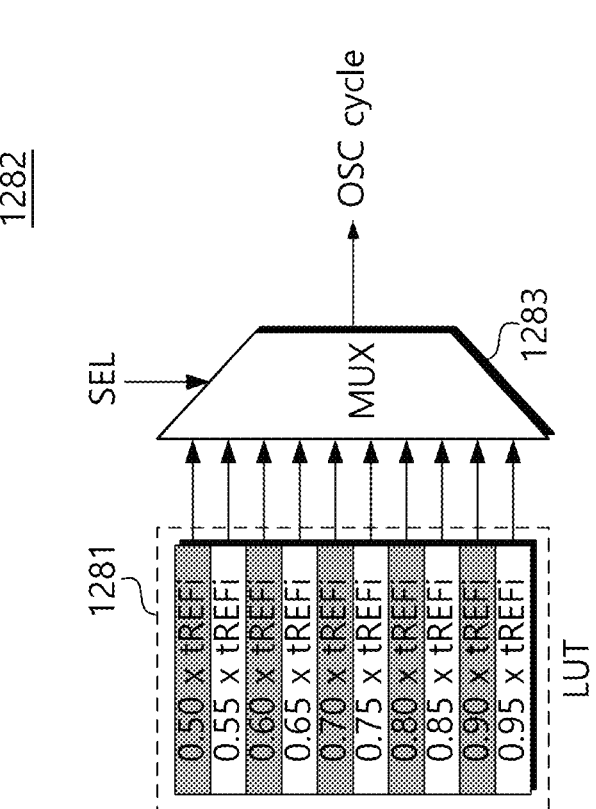
FIG. 4 is a block diagram showing an oscillator duty cycle controller of FIG. 3 according to an embodiment of the present invention.

FIG. 4 is a block diagram showing the oscillator duty cycle controller of FIG. 3 according to an embodiment. Referring to FIG. 4, the oscillator duty cycle controller 1282 may include a lookup table 1281 and a multiplexer 1283.

In the lookup table 1281, values for setting the period or duty cycle of the oscillator 1285 included in the duration detector 1284 are set. The lookup table 1281 provides delay time values from when the self-refresh entry command SRE is input until the self-refresh operation occurs in the form of a table. The oscillator cycle 'OSC cycle' selected by the multiplexer 1283 can be output by an MR4 operation code.

For example, if the reference time Tref, which is the skip standard for the self-refresh operation, needs to be set to 0.7 times the refresh period (tREFi), '0.70xtREFi' of the lookup table 1281 may be selected. Then, the multiplexer 1283 will output the oscillator cycle 'OSC cycle' corresponding to '0.70xtREFi' by the MR4 operation code. The lookup table 1281 and multiplexer 1283 may be implemented using memory and logic circuits.

Figure 5:
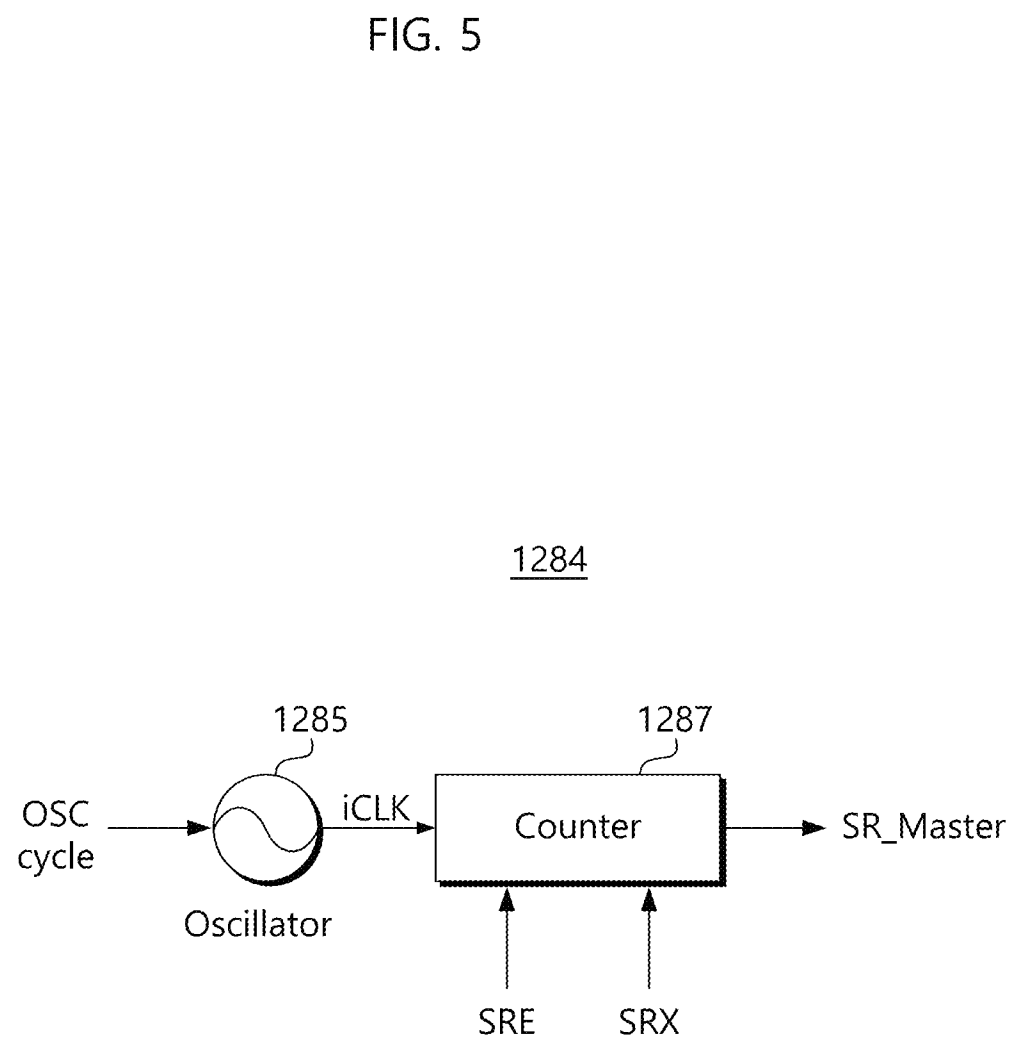

FIG. 5 is a block diagram showing the duration detector of FIG. 3 according to an embodiment. Referring to FIG. 5, the duration detector 1284 may include an oscillator 1285 and a counter 1287 (e.g., a counter circuit).

The oscillator 1285 generates a clock signal iCLK according to the oscillator cycle 'OSC cycle' provided by the oscillator duty cycle controller 1282. For example, the clock signal iCLK may be generated at a period of 0.5 to 1 times the refresh period tREFi depending on a set value. If the oscillator cycle 'OSC cycle' is set to '0.70xtREFi', the oscillator 1285 will generate a clock signal iCLK of the corresponding cycle and provide it to the counter 1287. The oscillator 1285 can be configured using various clock generation circuits. For example, the oscillator 1285 may generate a clock signal iCLK with a set period using means such as a phase locked loop (PLL) or a delay locked loop (DLL).

The counter 1287 starts counting from the moment the self-refresh entry (SRE) command is input using the clock signal iCLK. The counter 1287 may increment a value each time it detects a rising or falling edge of the clock signal iCLK to perform the counting. The counter 1287 may check whether the self-refresh exit command SRX is received until the reference time Tref elapses from the time the self-refresh entry command SRE is received. The counter 1287 generates a control signal SR_Master that indicates whether or not to actually execute the self-refresh command depending on whether the self-refresh exit command SRX is received. For example, it may be assumed that the period of the clock signal iCLK is set to 0.8 times the refresh period tREFi of the memory device 1200. Then, if the self-refresh exit command SRX is not input while the reference time (Tref-0.8xtREFi) has elapsed after the self-refresh entry command SRE is received, the counter 1287 activates the control signal SR_Master so that actual self-refresh starts. If the self-refresh exit command SRX is received before the reference time Tref of '0.8xtREFi' has elapsed after the self-refresh entry command SRE is provided, the counter 1287 will keep the control signal SR_Master in an inactive state so that the self-refresh operation is skipped.

Figure 6:
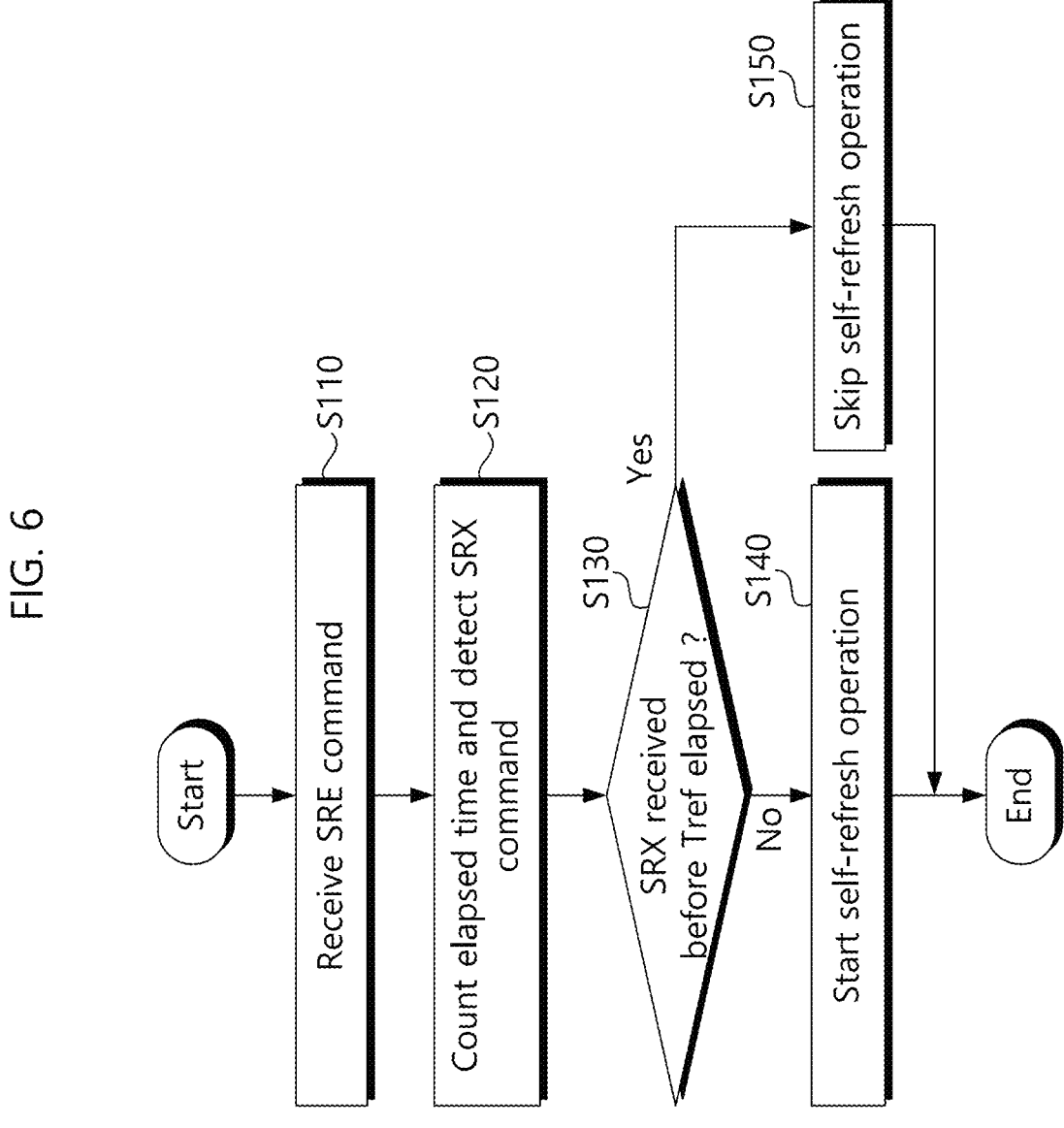
FIG. 6 is a flowchart showing a method of operating the self-refresh skip circuit according to an embodiment of the present invention.

FIG. 6 is a flowchart showing a method of operating a self-refresh skip circuit according to an embodiment of the present invention. Referring to FIG. 6, the self-refresh skip circuit 1280 detects whether a self-refresh exit command SRX is received before the reference time Tref elapses after a self-refresh entry command SRE is received. The self-refresh skip circuit 1280 can skip or execute the requested self-refresh operation according to the detection result.

In step S110, the self-refresh skip circuit 1280 receives the self-refresh entry command SRE provided from the outside. The self-refresh entry command SRE may be decoded by the command decoder 1230 (see FIG. 2) and provided to the self-refresh skip circuit 1280.

In step S120, the elapsed time is counted from the time point of reception of the self-refresh entry command SRE. For example, the elapsed time may be counted using the clock signal iCLK output from the oscillator 1285 (see FIG. 5) set to a period corresponding to the reference time Tref. At the same time, the self-refresh skip circuit 1280 may detect whether the self-refresh exit command SRX following the self-refresh entry command SRE is received.

In step S130, the self-refresh skip circuit 1280 determines whether the self-refresh exit command SRX is received before the reference time Tref elapses after the self-refresh entry command SRE is received. If the self-refresh exit command SRX is not received before the elapse of the reference time Tref ('No' direction), the procedure advances to step S140. On the other hand, if it is determined that the self-refresh exit command SRX has been received before the elapse of the reference time Tref ('Yes' direction), the procedure advances to step S150.

In step S140, the self-refresh skip circuit 1280 activates the control signal SR_Master to start the self-refresh operation requested through the self-refresh entry command SRE. Then, in response to the activated control signal SR_Master, the refresh controller 1250 (see FIG. 3) starts the requested self-refresh operation (e.g., all-bank refresh).

In step S150, the self-refresh skip circuit 1280 deactivates the control signal SR_Master to skip the self-refresh operation requested through the self-refresh entry command SRE. Then, in response to the deactivated control signal SR_Master, the refresh controller 1250 skips the requested self-refresh operation.

According to an embodiment of the present invention, the memory device 1200 can skip the self-refresh operation when the duration between the self-refresh entry command SRE and the self-refresh exit command SRX is shorter than the reference time Tref. Accordingly, when self-refresh entry/exit commands with a short duration are provided, the memory device 1200 determines to skip the self-refresh operation. Accordingly, the memory device 1200 can autonomously skip unnecessary self-refresh operations. Thus, the occurrence of logic errors and power consumption due to unnecessary self-refresh operations occurring within the memory device 1200 can be reduced.

Figure 7:
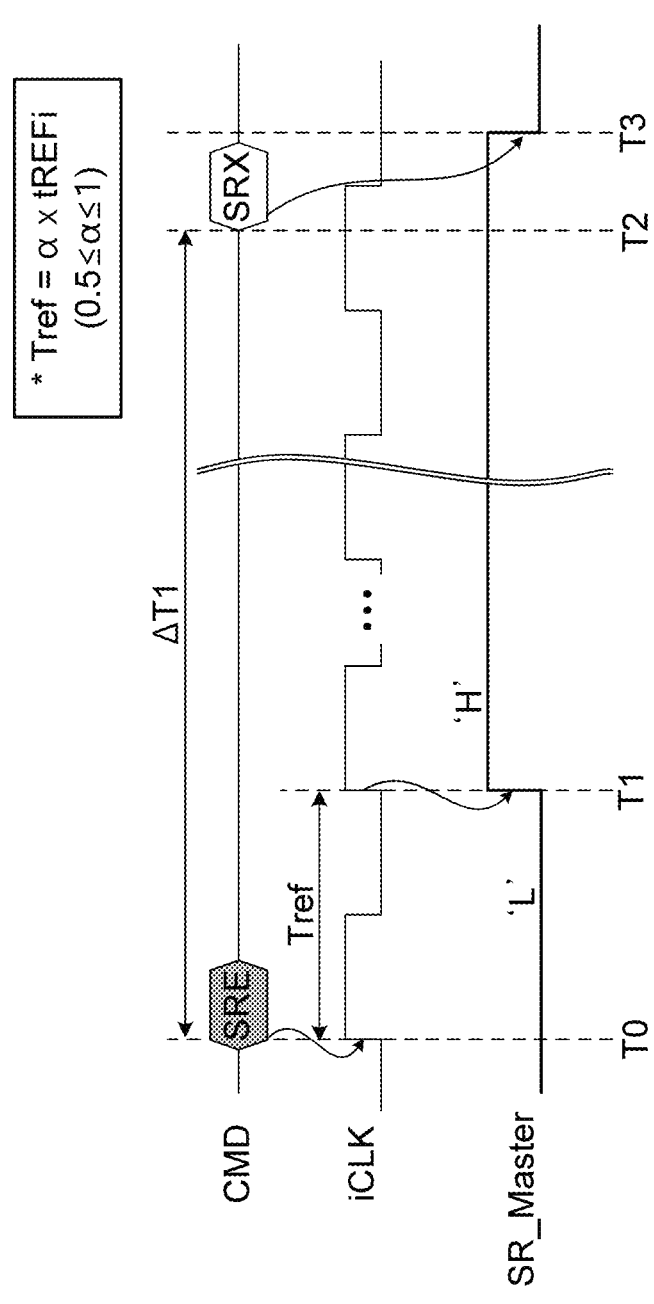
FIG. 7 is a timing diagram showing an example operation of the self-refresh skip circuit.

FIG. 7 is a timing diagram showing an example operation of the self-refresh skip circuit according to an embodiment. Referring to FIG. 7, the operation of the self-refresh skip circuit 1280 (see FIG. 3) when the duration (ΔT1) between the self-refresh entry command SRE and the self-refresh exit command SRX is longer than the reference time Tref is shown. That is, the case is shown where the self-refresh exit command SRX is received after the reference time Tref has elapsed since the self-refresh entry command SRE is received.

At time T0, a self-refresh entry command SRE is input from the outside. Then, the self-refresh skip circuit 1280 uses the duration detector 1284 (see FIG. 5) to count the elapsed time from the point in time T0 at which the self-refresh entry command SRE is received. At this time, the self-refresh entry command SRE is received, but the self-refresh operation does not start. Accordingly, the control signal SR_Master will maintain the inactive low level 'L' from time T0 to time T1. Due to the inactive state of the control signal SR_Master, the refresh controller 1250 does not start the self-refresh operation of the selected memory area.

The time point T1 corresponds to the time when the reference time Tref has elapsed from the time point T0 at which the self-refresh entry command SRE is received. However, the self-refresh exit command SRX has not been received while the reference time Tref has elapsed since the self-refresh entry command SRE has been received. Accordingly, the self-refresh skip circuit 1280 activates the level of the control signal SR_Master to the high level 'H'. Upon activation of the control signal SR_Master, the refresh controller 1250 starts the self-refresh operation of the selected memory area. For example, the refresh controller 1250 may start an all-bank refresh ABR operation. The self-refresh operation for the selected memory area will continue until the self-refresh exit command SRX is detected at time point T3.

At time point T2, a self-refresh exit command SRX is received. Accordingly, the duration corresponding to the time difference between the self-refresh entry command SRE and the self-refresh exit command SRX will be counted as 'ΔT1'. Since the duration is longer than the reference time Tref, the self-refresh operation of the memory device 1200 may be activated. In response to the self-refresh exit command SRX, the control signal SR_Master is deactivated to low level 'L' at time point T3. Accordingly, the self-refresh operation triggered by the self-refresh entry command SRE is terminated.

In the above, the operation of the self-refresh skip circuit 1280 when the duration ΔT1 between the self-refresh entry command SRE and the self-refresh exit command SRX is longer than the reference time Tref has been described. In other words, if the self-refresh exit command SRX is not received until the reference time Tref elapses from the self-refresh entry command SRE being received, the self-refresh operation of the selected memory area begins.

Figure 8:
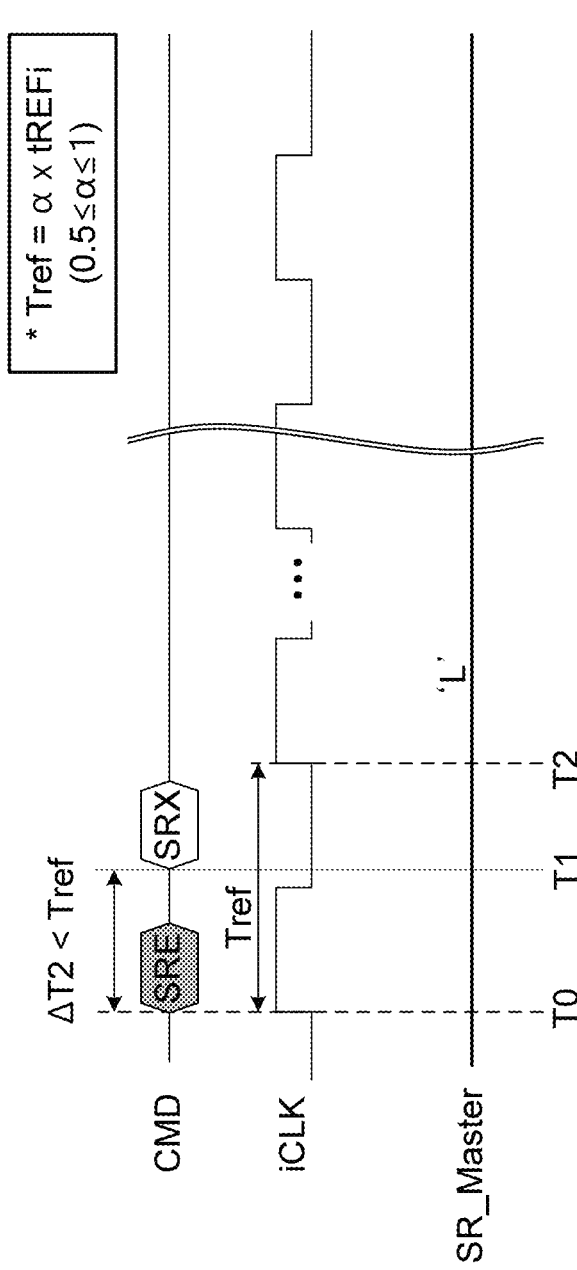
FIG. 8 is a timing diagram showing an example operation of the self-refresh skip circuit.

FIG. 8 is a timing diagram showing the self-refresh skip operation of the self-refresh skip circuit according an embodiment. Referring to FIG. 8, The operation of the self-refresh skip circuit 1280 (see FIG. 3) when the duration ΔT2 between a self-refresh entry command SRE and a self-refresh exit command SRX is shorter than the reference time Tref, is shown.

At time point T0, the self-refresh entry command SRE is input from the outside. Then, the self-refresh skip circuit 1280 uses the duration detector 1284 (see FIG. 5) to count the elapsed time from the point in time T0 at which the self-refresh entry command SRE is received. At this time, the self-refresh operation does not start immediately after the self-refresh entry command SRE is received. Accordingly, the control signal SR_Master will maintain the inactive low level 'L' until the reference time Tref elapses from time point T0. Due to the inactive state of the control signal SR_Master, the refresh controller 1250 maintains the self-refresh operation of the selected memory area in an inactive state.

The self-refresh exit command SRX is received at time point T1. The time point T1 corresponds to a time before the reference time Tref elapses from the time point T0 at which the self-refresh entry command SRE is received. Since the self-refresh exit command SRX is received before the reference time Tref has elapsed, the self-refresh skip circuit 1280 maintains the level of the control signal SR_Master at the inactive low level 'L'. The duration corresponding to the time difference between the self-refresh entry command SRE and the self-refresh exit command SRX will be counted as 'ΔT2'. Because the duration time ΔT2 is shorter than the reference time Tref, the self-refresh operation of the memory device 1200 is skipped.

In the above, the operation of the self-refresh skip circuit 1280 when the duration ΔT2 between the self-refresh entry command SRE and the self-refresh exit command SRX is shorter than the reference time Tref has been described. That is, if the self-refresh exit command SRX is received before the reference time Tref elapses after the self-refresh entry command SRE is received, the self-refresh operation of the selected memory area can be skipped.

FIG. 9 is a flowchart showing a method of operating the self-refresh skip circuit according to an embodiment of the present invention. Referring to FIG. 9, when a self-refresh entry command SRE is received, the self-refresh skip circuit 1280 delays execution of an all-bank refresh ABR operation by a reference time Tref. Additionally, an execution or a skip of the delayed all-bank refresh ABR operation is determined depending on whether the self-refresh exit command SRX is received within the reference time Tref.

In step S210, the self-refresh skip circuit 1280 receives the self-refresh entry command SRE provided from the outside. The self-refresh entry command SRE is decoded by the command decoder 1230 (see FIG. 2) and then provided to the self-refresh skip circuit 1280.

In step S220, the self-refresh skip circuit 1280 delays the all-bank refresh (ABR) operation, which would otherwise start immediately upon receipt of the existing self-refresh entry command SRE, by the reference time Tref. In the case of the memory device 1200 in some embodiments, an all-bank refresh (ABR) operation may be set to start when the self-refresh entry command SRE is received. When the self-refresh entry command SRE is received, the self-refresh skip circuit 1280 according to an embodiment of the present invention can delay the start time of the all-bank refresh (ABR) operation by the reference time Tref. At the same time, the self-refresh skip circuit 1280 may detect whether the self-refresh exit command SRX is received.

In step S230, the self-refresh skip circuit 1280 determines whether the self-refresh exit command SRX is received before the reference time Tref elapses from the time point T1 at which the self-refresh exit command SRE is received. If it is determined that the self-refresh exit command SRX has not been received before the elapse of the reference time Tref ('No' direction), the procedure advances to step S240. On the other hand, if it is determined that the self-refresh exit command SRX has been received before the elapse of the reference time Tref ('Yes' direction), the procedure advances to step S250.

In step S240, the self-refresh skip circuit 1280 activates the control signal SR_Master to start the all-bank refresh ABR operation requested through the self-refresh entry command SRE. Then, in response to the activated control signal SR_Master, the refresh controller 1250 (see FIG. 3) starts an all-bank refresh ABR operation for the selected memory area.

In step S250, the self-refresh skip circuit 1280 deactivates the control signal SR_Master to skip the self-refresh operation requested through the self-refresh entry command SRE. Then, in response to the deactivated control signal SR_Master, the refresh controller 1250 (see FIG. 3) may cancel or ignore the requested self-refresh command.

Due to the function of the self-refresh skip circuit 1280 according to an embodiment of the present invention, the memory device 1200 can skip the all-bank refresh ABR operation when the duration, which is the time interval between the self-refresh entry command SRE and the self-refresh exit command SRX, is shorter than the reference time Tref. In other words, when self-refresh entry/exit commands with a short duration are provided, the memory device 1200 determines to skip the all-bank refresh ABR operation. Through this, the memory device 1200 can autonomously skip unnecessary self-refresh operations. Thus, logic errors and power consumption due to unnecessary self-refresh operations can be reduced.

Figure 10:
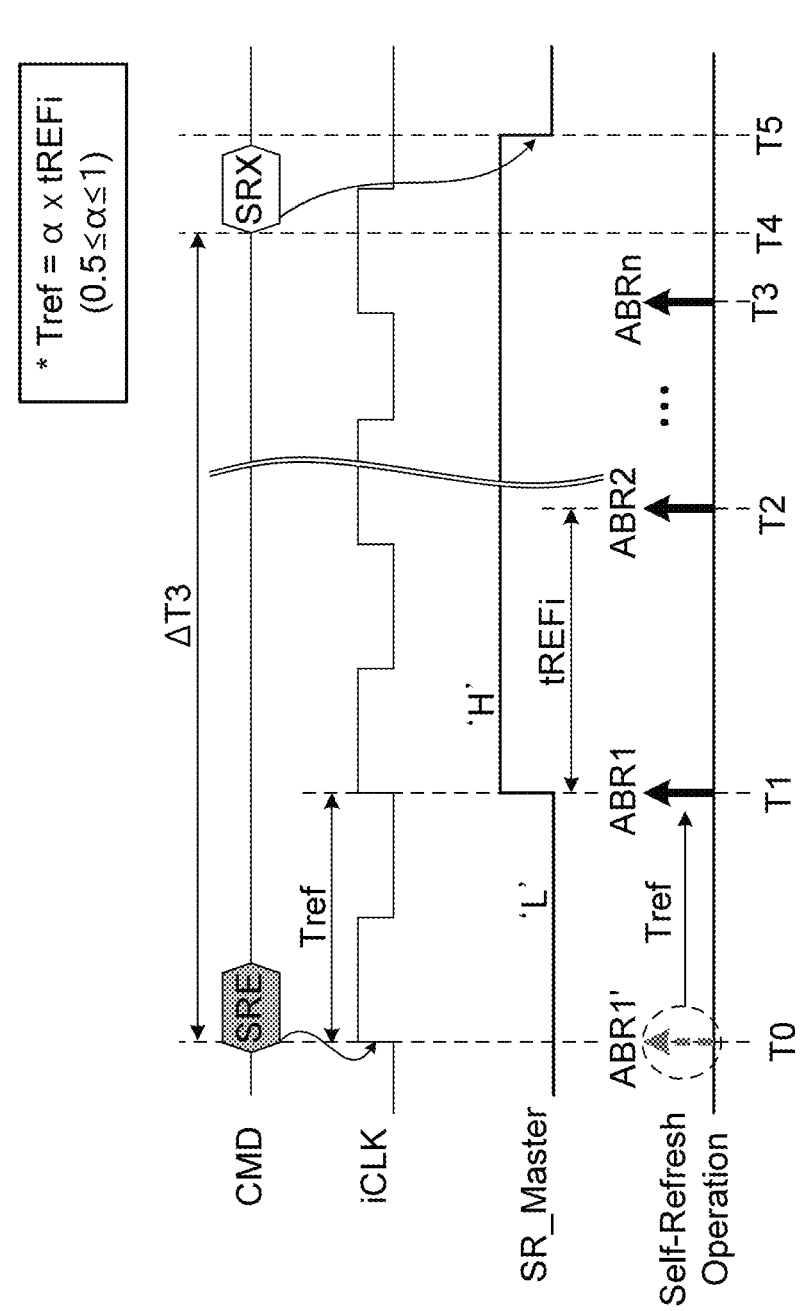
FIG. 10 is a timing diagram showing an example operation of the self-refresh skip circuit described in FIG. 9.

FIG. 10 is a timing diagram showing an example operation of the self-refresh skip circuit described in FIG. 9. Referring to FIG. 10, an operation of the self-refresh skip circuit 1280 (see FIG. 3) when the duration (ΔT3) between the self-refresh entry command SRE and the self-refresh exit command SRX is longer than the reference time Tref, is shown.

At time point T0, the self-refresh entry command SRE is input from the outside. Then, the self-refresh skip circuit 1280 delays the all-bank refresh ABR operation (e.g., ABR1'), which would otherwise start immediately upon receipt of the self-refresh entry command SRE, by the reference time Tref. That is, the self-refresh skip circuit 1280 will maintain the control signal SR_Master at the inactive low level 'L' (e.g., a first logic level) for the reference time Tref at point T0. Due to the inactive state of the control signal SR_Master, the refresh controller 1250 does not start the self-refresh operation of the selected memory area. At the same time, the self-refresh skip circuit 1280 may detect whether the self-refresh exit command SRX is received.

The time point T1 corresponds to the time when the reference time Tref has elapsed from the time point T0 at which the self-refresh entry command SRE is received. However, the self-refresh exit command SRX was not received while the reference time Tref elapsed after the self-refresh entry command SRE was received. Accordingly, the self-refresh skip circuit 1280 activates the level of the control signal SR_Master to the high level 'H' (e.g., a second logic level). Upon activation of the control signal SR_Master, the refresh controller 1250 starts a self-refresh operation of the selected memory area. That is, the refresh controller 1250 starts the delayed all-bank refresh ABR1 operation. Afterwards, all-bank refresh (ABR2, ABR3, . . . , ABRn) operations will continue at each refresh cycle tREFi until the self-refresh exit command SRX is received. For example, an all-bank refresh operation may be periodically performed according to the refresh cycle tREFi until the self-refresh exit command SRX is received.

At time point T4, the self-refresh exit command SRX is received. Accordingly, the duration corresponding to the time difference between the self-refresh entry command SRE and the self-refresh exit command SRX will be counted as 'ΔT3'. As a result, since the duration is longer than the reference time Tref, the self-refresh operation of the memory device 1200 is activated. In response to the self-refresh exit command SRX, the control signal SR_Master is deactivated to low level 'L' at time point T5. Accordingly, the self-refresh operation triggered by the self-refresh entry command SRE is terminated.

In the above, the operation of the self-refresh skip circuit 1280 when the duration ΔT3 between the self-refresh entry command SRE and the self-refresh exit command SRX is longer than the reference time Tref has been described. That is, if the self-refresh exit command SRX is not received from the time the self-refresh entry command SRE is received until the reference time Tref has elapsed, the self-refresh operation of the selected memory area can be started.

Figure 11:
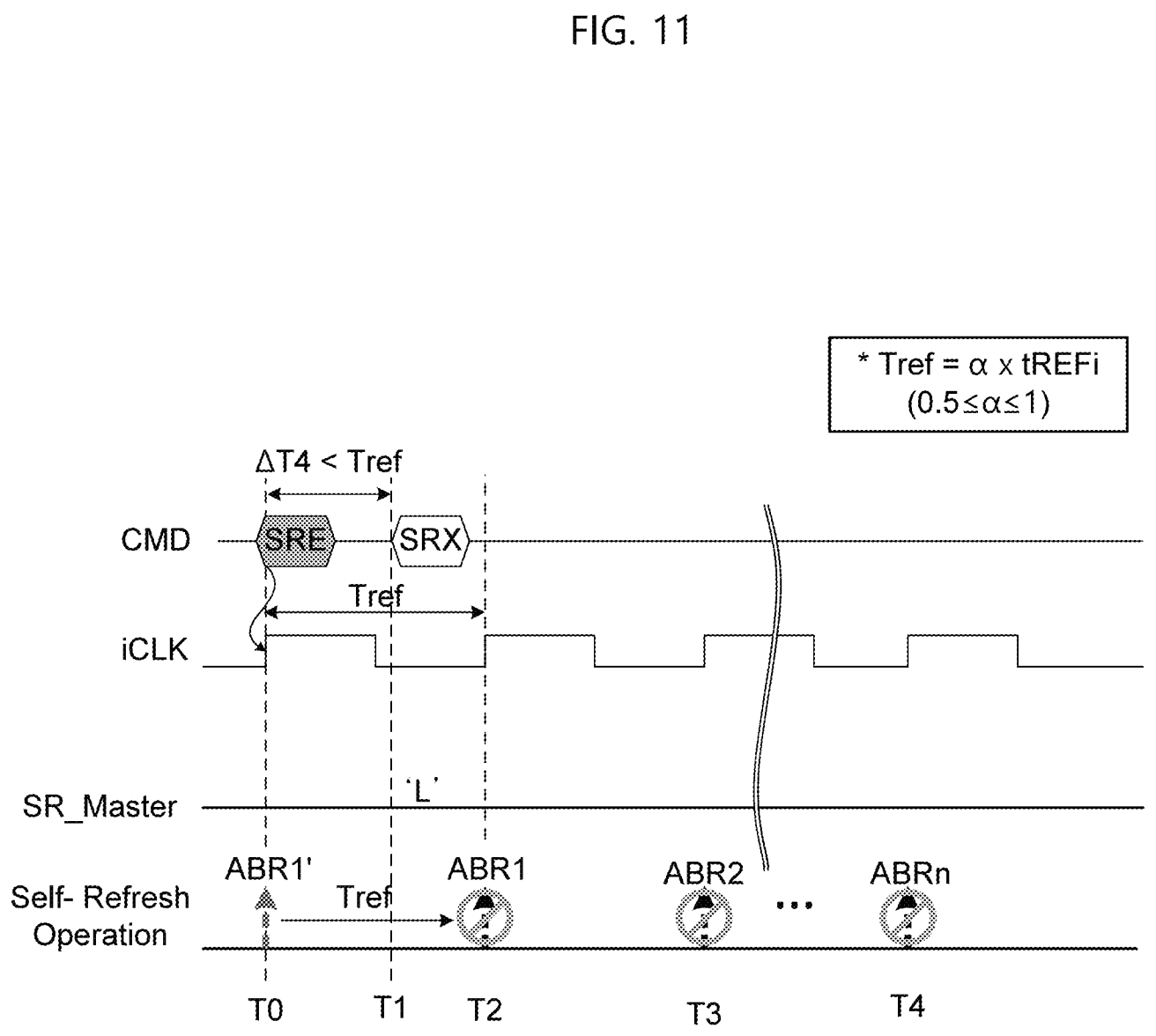

FIG. 11 is a timing diagram showing an example operation of the self-refresh skip circuit described in FIG. 9. Referring to FIG. 11, a case is shown where the duration ΔT4 between the self-refresh entry command SRE and the self-refresh exit command SRX is shorter than the reference time Tref. That is, the operation of the self-refresh skip circuit 1280 (see FIG. 3) when the self-refresh exit command SRX is received before the reference time Tref has elapsed since the self-refresh entry command SRE is received, is shown as an example.

At time point T0, the self-refresh entry command SRE is input from the outside. Then, the self-refresh skip circuit 1280 delays the all-bank refresh ABR operation, which would otherwise start immediately upon receipt of the self-refresh entry command SRE, by the reference time Tref. That is, the self-refresh skip circuit 1280 will maintain the control signal SR_Master at the inactive low level 'L' for the reference time Tref at time point T0. Due to the inactive state of the control signal SR_Master, the refresh controller 1250 does not start the self-refresh operation of the selected memory area. At the same time, the self-refresh skip circuit 1280 may detect whether the self-refresh exit command SRX is received.

At time point T1, the self-refresh exit command SRX is received. The time point T1 corresponds to a time before the reference time Tref elapses from the time point T0 at which the self-refresh entry command SRE is received. Since the self-refresh exit command SRX is received before the reference time Tref has elapsed, the self-refresh skip circuit 1280 maintains the level of the control signal SR_Master at a low level 'L', which is an inactive state. The duration corresponding to the time difference between the self-refresh entry command SRE and the self-refresh exit command SRX will be counted as 'ΔT4'. Since the duration ΔT4 is shorter than the reference time Tref, the self-refresh operation of the memory device 1200 can be skipped or omitted.

In the above, the operation of the self-refresh skip circuit 1280 when the duration ΔT4 between the self-refresh entry command SRE and the self-refresh exit command SRX is shorter than the reference time Tref has been described. That is, if the self-refresh exit command SRX is received before the reference time Tref elapses after the self-refresh entry command SRE is received, the all-bank refresh operation of the selected memory area may be skipped.

Figure 12:
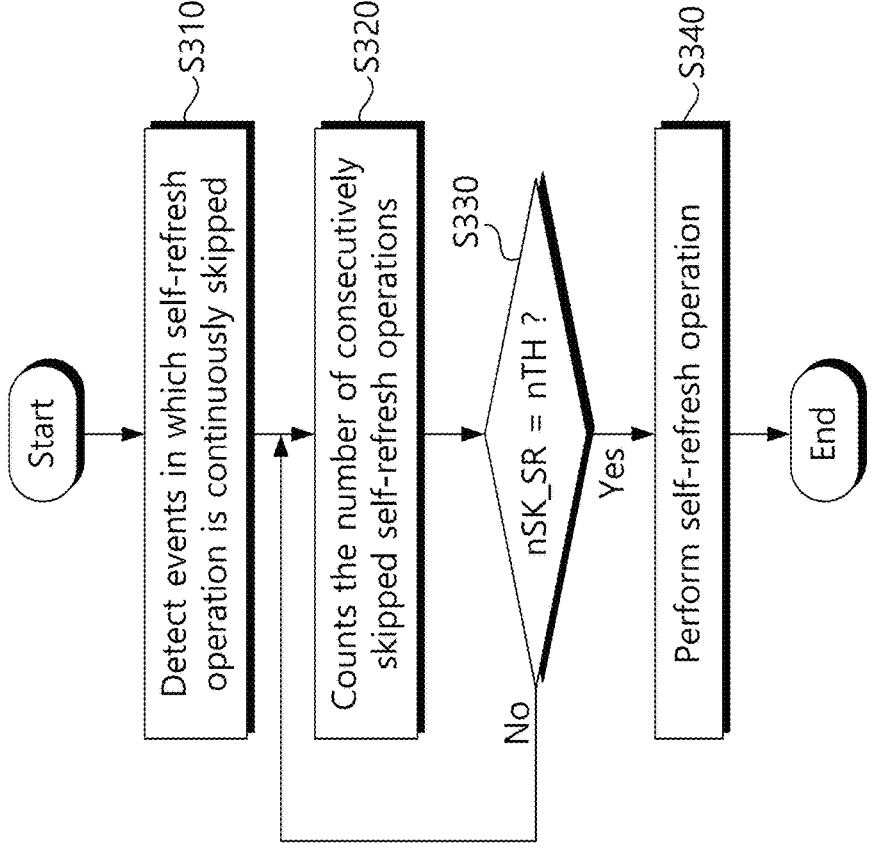
FIG. 12 is a flowchart showing a method of operating the self-refresh skip circuit according to an embodiment of the present invention.

FIG. 12 is a flowchart showing a method of operating a self-refresh skip circuit according to an embodiment of the present invention. The self-refresh operation may be continuously skipped because events with a duration shorter than the reference time Tref occur continuously. In this case, the self-refresh skip circuit 1280 can detect this event and prevent excessive skipping of the self-refresh operation. Referring to FIG. 12, when the self-refresh operation is continuously skipped more than the reference number nTH, the self-refresh skip circuit 1280 may force the self-refresh operation thereafter even if it meets the skip condition.

In step S310, the self-refresh skip circuit 1280 detects an event in which the self-refresh operation is skipped two or more times in succession. For example, there may be cases where the duration between the self-refresh entry command SRE and the self-refresh exit command SRX is shorter than the reference time Tref, and an interval between the self-refresh entry command SRE and the subsequent self-refresh entry command SRE is shorter than the refresh period tREFi. Accordingly, this corresponds to a case where skipping of the self-refresh operation occurs two or more times in succession. If the self-refresh operation is skipped continuously and repeated, a required self-refresh operation to ensure data integrity may also be skipped, resulting in an error.

In step S320, the self-refresh skip circuit 1280 counts the number of times the self-refresh operation is skipped nSK_SR when the self-refresh operation is skipped two or more times in succession. For example, he self-refresh skip circuit 1280 may count the number of consecutively skipped self-refresh operation. For example, the self-refresh skip circuit 1280 may include a separate counter to count the number of times the self-refresh operation is continuously skipped.

In step S330, the self-refresh skip circuit 1280 determines whether the number of consecutive skips nSK_SR of the self-refresh operation has reached the threshold number nTH. In an example, it is assumed that the threshold number nTH is '3'. Then, when the skip number nSK_SR of the continuous self-refresh operation reaches '3', the self-refresh skip circuit 1280 executes the externally requested self-refresh operation regardless of the duration. If the skip number nSK_SR of the continuous self-refresh operation is determined to be equal to the threshold number nTH ('Yes' direction), the procedure advances to step S340. On the other hand, if it is determined that the skip number nSK_SR of the continuous self-refresh operation is not equal to the threshold number nTH ('No' direction), the procedure returns to step S320.

In step S340, the self-refresh skip circuit 1280 activates the control signal SR_Master to start the self-refresh operation requested through the self-refresh entry command SRE. Then, in response to the activated control signal SR_Master, the refresh controller 1250 (see FIG. 3) starts a self-refresh operation (e.g., ABR) operation.

In the above, functions according to an embodiment of the self-refresh skip circuit 1280 of the present invention have been described. An event in which the duration between the self-refresh entry command SRE and the self-refresh exit command SRX is shorter than the reference time Tref may occur continuously and repeatedly. In this case, in the worst case, the self-refresh operation may not be performed in time and the stored data may be lost. Accordingly, when the self-refresh operation is continuously skipped more than the reference number nTH, the self-refresh skip circuit 1280 may be set to execute the self-refresh operation thereafter even if it meets the skip condition.

Figure 13:
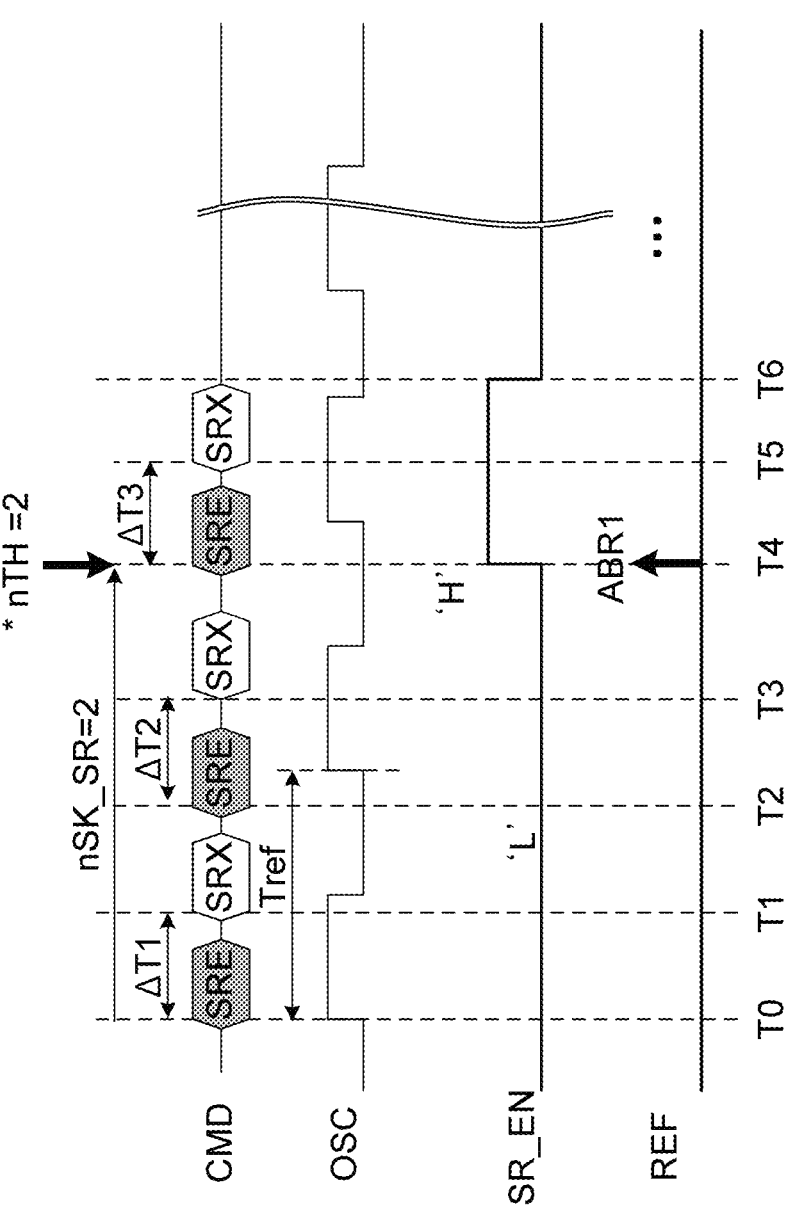
FIG. 13 is a timing diagram for the self-refresh method of FIG. 12.

FIG. 13 is a timing diagram showing the self-refresh method of FIG. 12. Referring to FIG. 13, events in which the duration times (ΔT1, ΔT2, and ΔT3) between the self-refresh entry command SRE and the self-refresh exit command SRX are shorter than the reference time Tref may occur continuously. Here, it is assumed that the threshold number nTH is '2'.

A self-refresh entry command SRE is received at time point T0, and a self-refresh exit command SRX is applied at time point T1. At this time, the duration ΔT1 between the self-refresh entry command SRE and the self-refresh exit command SRX is shorter than the reference time Tref and corresponds to the self-refresh skip condition. Therefore, the self-refresh entry command SRE requested at time point T0 is ignored.

The self-refresh entry command SRE is received at time point T2, and the self-refresh exit command SRX is applied at time point T3. At this time, the duration ΔT2 between the self-refresh entry command SRE and the self-refresh exit command SRX is shorter than the reference time Tref and corresponds to the self-refresh skip condition. Accordingly, the self-refresh entry command SRE requested at time point T2 is also ignored. In the end, the self-refresh operation is skipped twice continuously.

The self-refresh entry command SRE is received at time point T4, and the self-refresh exit command SRX is applied at time point T5. At this time, the duration ΔT3 between the self-refresh entry command SRE and the self-refresh exit command SRX is shorter than the reference time Tref, corresponding to the self-refresh skip condition. However, since the number of consecutive self-refresh skips nSK_SR has already reached the threshold number (nTH=2) at time T3, the self-refresh skip circuit 1280 activates the control signal SR_Master to high level 'H' at time point T4. Then, a self-refresh operation (e.g., ABR1) may be started in the refresh controller 1250.

In the above, the method was described with respect to an event in which the duration between the self-refresh entry command SRE and the self-refresh exit command SRX is shorter than the reference time Tref occurs continuously and repeatedly. In this case, in the worst case, the self-refresh operation may not be performed in time and the stored data may be lost. However, the memory device 1200 according to an embodiment of the present invention can detect this case and forcibly perform the self-refresh operation.

Figure 14:
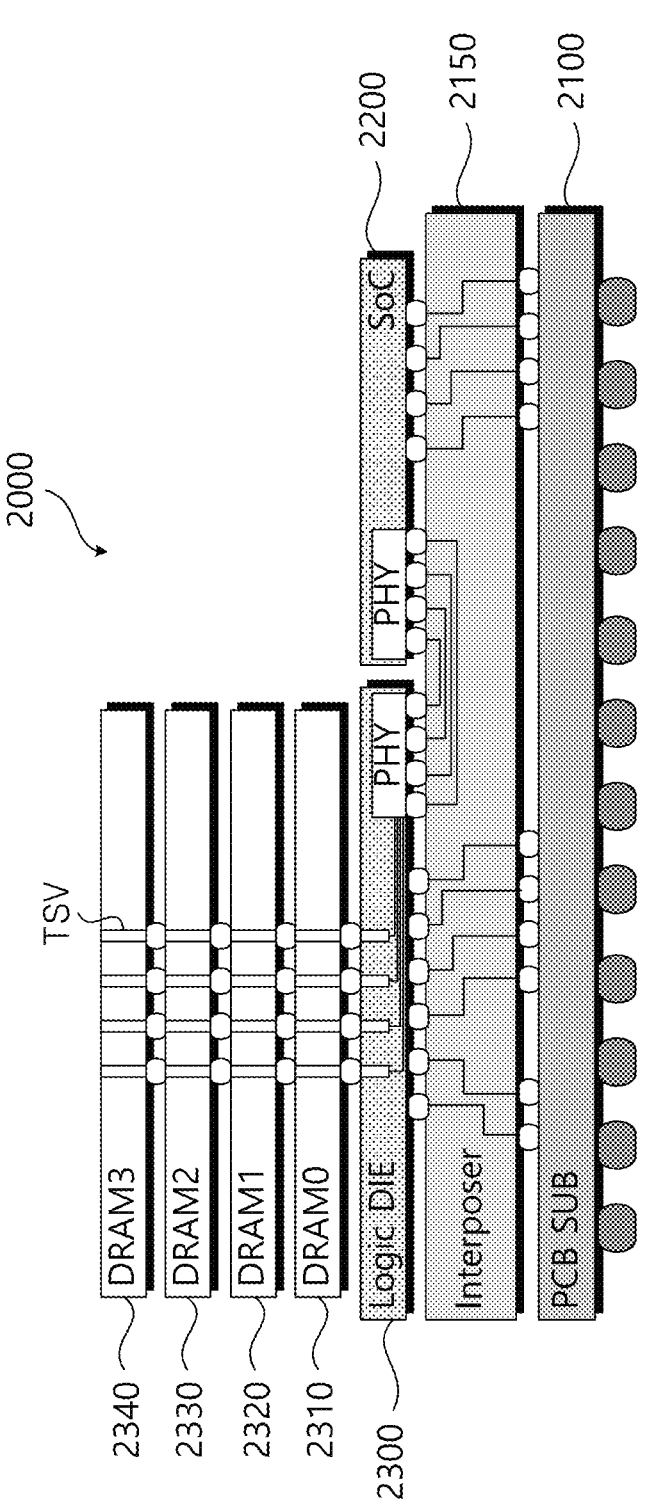
FIG. 14 is a cross-sectional view showing a memory system according to an embodiment of the present invention.

FIG. 14 is a cross-sectional view showing a memory system according to an embodiment of the present invention. Referring to FIG. 14, a memory system 2000 implemented as a stacked memory includes a printed circuit board (PCB) substrate 2100, an interposer 2150, a host die 2200, a logic die 2300, and high-bandwidth DRAMs 2310 (DRAM0), 2320 (DRAM1), 2330 (DRAM2) and 2340 (DRAM3).

The memory system 2000 connects the high-bandwidth DRAMs 2310, 2320, 2330, and 2340 and the host die 2200 using an interposer 2150. The interposer 2150 is disposed on the upper part of the PCB board 2100 and is electrically connected to the PCB board 2100 through flip chip bumps FB.

A host die 2200, a logic die 2300, and high-bandwidth DRAMs 2310, 2320, 2330, and 2340 in a stacked structure may be disposed on the interposer 2150. To implement the memory system 2000, TSV lines are formed in the plurality of high-bandwidth DRAMs 2310, 2320, 2330, and 2340. The TSV lines may be electrically connected to micro bumps formed between the plurality of high-bandwidth DRAMs 2310, 2320, 2330, and 2340.

Here, the plurality of high-bandwidth DRAMs 2310, 2320, 2330, and 2340 can each skip the self-refresh operation according to the duration between a self-refresh entry command SRE and a self-refresh exit command SRX. Accordingly, each of the plurality of high-bandwidth DRAMs 2310, 2320, 2330, and 2340 can reduce logic errors or reduce power consumption by omitting unnecessary self-refresh operations.

Figure 15:
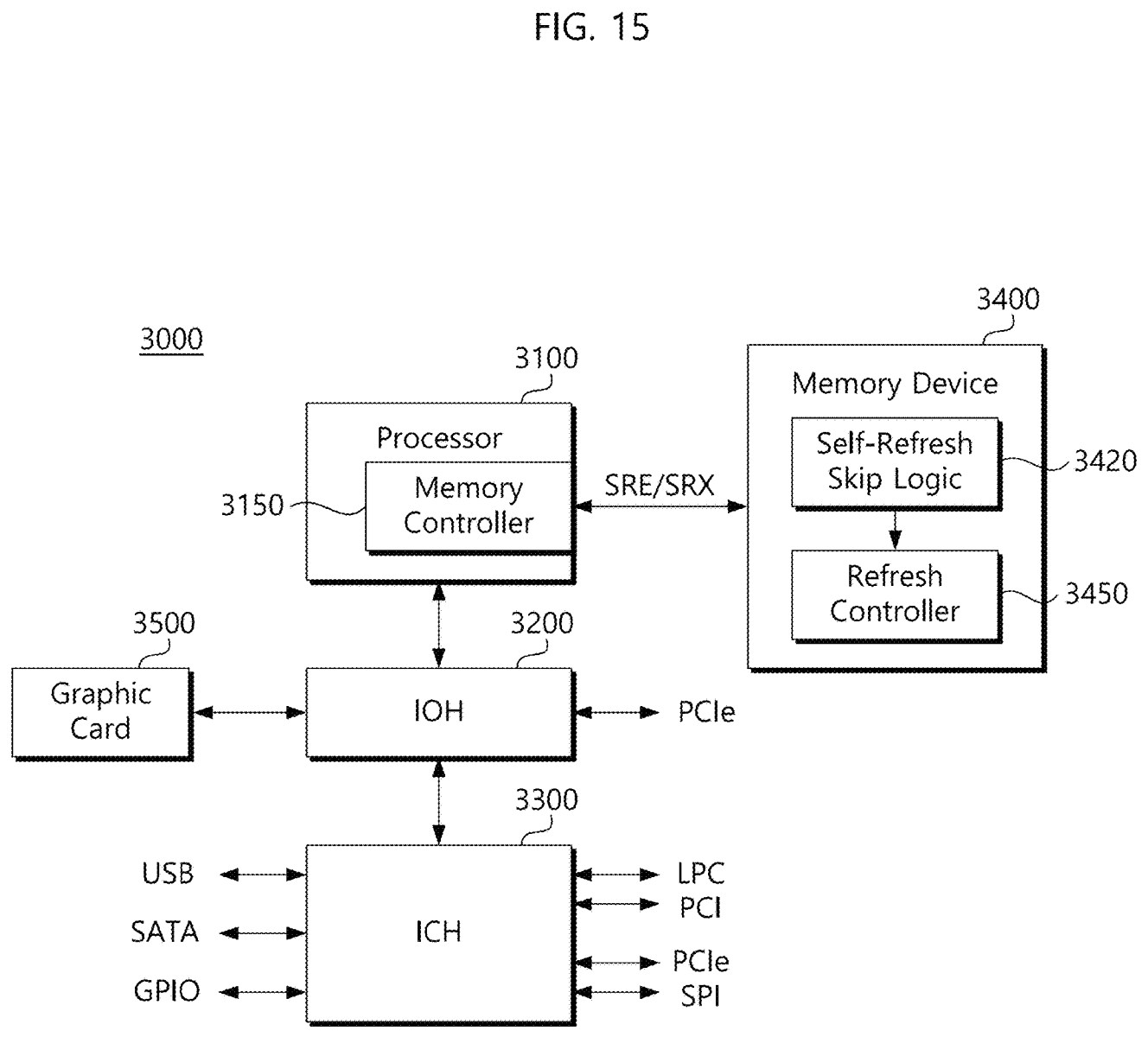

FIG. 15 is a block diagram showing an example of applying a memory device including a self-refresh skip circuit according to an embodiment of the present invention to a computing system. Referring to FIG. 15, the computing system 3000 includes a processor 3100, an input/output hub 3200, an input/output controller hub 3300, a memory device 3400, and a graphics card 3500. According to the embodiment, the computing system 3000 may be at least one of a personal computer (PC), a server computer, a workstation, a laptop, a mobile phone, a smart phone, a Personal digital assistant (PDA), Portable Multimedia Player (PMP), Digital Camera, Digital Television, Set-Top Box, Music Player, a portable game console, a navigation system, etc.

Processor 3100 may perform various computing functions, such as specific calculations or tasks. For example, the processor 3100 may be a microprocessor or a central processing unit CPU. According to the embodiment, the processor 3100 may include one processor core (Single Core) or may include a plurality of processor cores (Multi-Core). For example, the processor 3100 may include dual-core, quad-core, hexa-core, etc. Additionally, FIG. 15 shows a computing system 3000 including a single processor 3100, but according to alternate embodiments, the computing system 3000 may include a plurality of processors. Additionally, according to an embodiment, the processor 3100 may further include a cache memory located internally or externally. The processor 3100 may include a memory controller 3150 that controls the operation of the memory device 3400. According to an embodiment, the memory controller 3150 is located within the input/output hub 3200.

The memory device 3400 includes a self-refresh skip circuit 3420 and a refresh controller 3450 for a self-refresh skip. When the self-refresh skip circuit 3420 receives a self-refresh entry command SRE, it can delay the start of the self-refresh operation by a specific time. In addition, the self-refresh skip circuit 3420 determines to skip the delayed self-refresh operation when the subsequent self-refresh exit command SRX is received before the reference time Tref from the time of receiving the self-refresh entry command SRE. On the other hand, the self-refresh skip circuit 3420 may determine to immediately start the delayed self-refresh operation when the subsequent self-refresh exit command SRX is received after the reference time Tref from the time of receiving the self-refresh entry command SRE. Here, the reference time Tref can be set shorter than the refresh period tREFi. To set the reference time Tref, the self-refresh skip circuit 3420 may further include a lookup table LUT set through a mode register set MRS command. The refresh controller 3450 performs a self-refresh on memory cells under the control of the self-refresh skip circuit 3420. The self-refresh skip logic 3420 may be implemented by self-refresh skip circuit 1280 and the refresh controller 3450 may be implemented by the refresh controller 1250.

The input/output hub 3200 can manage data transmission between devices such as the graphics card 3500 and the processor 3100. The input/output hub 3200 may be connected to the processor 3100 through various interfaces. For example, the input/output hub 3200 and the processor 3100 can be connected to a variety of standard interfaces, such as a Front Side Bus FSB, a System Bus, HyperTransport, Lightning Data Transport (LDT), QuickPath Interconnect (QPI), Common System Interface, and Peripheral Component Interface-Express (CSI). Although FIG. 15 shows a computing system 3000 including one input/output hub 3200, according to the embodiment, the computing system 3000 may include a plurality of input/output hubs.

The input/output hub 3200 can provide various interfaces with devices. For example, the input/output hub 3200 may include an Accelerated Graphics Port (AGP) interface, a Peripheral Component Interface-Express (PCIe) interface, a Communications Streaming Architecture (CSA) interface, etc.

The graphics card 3500 may be connected to the input/output hub 3200 through AGP or PCIe. The graphics card 3500 can control a display device for displaying images. The graphics card 3500 may include an internal processor for processing image data, an internal processor, and an internal semiconductor memory device. According to an embodiment, the input/output hub 3200 may include a graphics device along with a graphics card 3500 located outside the input/output hub 3200 or inside the input/output hub 3200 instead of the graphics card 3500. The graphics device included in the input/output hub 3200 may be an integrated graphics device. Additionally, the input/output hub 3200 including a memory controller and a graphics device may be called a graphics and memory controller hub (GMCH).

The input/output controller hub 3300 can perform data buffering and interface arbitration so that various system interfaces operate efficiently. The input/output controller hub 3300 may be connected to the input/output hub 3200 through an internal bus. For example, the input/output hub 3200 and the input/output controller hub 3300 may be connected through a direct media interface (DMI), a hub interface, an enterprise southbridge interface (ESI), PCIe, etc. The input/output controller hub 3300 can provide various interfaces with peripheral devices. For example, the input/output controller hub 3300 may include at least one of a Universal Serial Bus (USB) port, a serial ATA (Serial Advanced Technology Attachment; SATA) port, a general purpose input/output (GPIO), and a low pin count. (Low Pin Count; LPC) bus, Serial Peripheral Interface (SPI), PCI, PCIe, etc.

According to an embodiment, two or more components among the processor 3100, the input/output hub 3200, or the input/output controller hub 3300 are implemented by a single chipset.

In addition to the above-described embodiments, the present invention may include simple design changes. Therefore, the scope of the present invention should not be limited to the above-described embodiments.

What is claimed is:

1. A self-refresh method of a semiconductor memory device, comprising:
   receiving a self-refresh entry command associated with a self-refresh operation;
   counting an elapsed time from a time of receiving the self-refresh entry command;
   skipping the self-refresh operation depending on whether a self-refresh exit command is received before the counted elapsed time exceeds a reference time; and
   counting a number of times the self-refresh operation is continuously skipped.

2. The method of claim 1, wherein the reference time is shorter than or equal to the refresh period of the semiconductor memory device.

3. The method of claim 1, wherein the skipping skips the self-refresh operation when the self-refresh exit command is received before the elapsed time exceeds the reference time.

4. The method of claim 3, further comprises executing the self-refresh operation when the self-refresh exit command is not received before the elapsed time exceeds the reference time.

5. The method of claim 4, wherein the executing of the self-refresh operation perform an all-bank refresh operation.

6. The method of claim 5, wherein the self-refresh operation is terminated in response to receipt of the self-refresh exit command.

7. The method of claim 1, further comprising:
   determining whether the number of times reaches a threshold number; and
   executing the self-refresh operation when the number of times reaches the threshold number regardless of a time difference between receipt of the self-refresh entry command and the self-refresh exit command.

8. A semiconductor memory device, comprising:
   a cell array including a plurality of dynamic-random-access-memory (DRAM) cells;

a command decoder configured to decode a command associated with a self-refresh operation to output a self-refresh entry command and a self-refresh exit command;
   a control circuit configured to generate a control signal to skip the self-refresh operation when a time difference between a reception time of the self-refresh entry command and a reception time of the self-refresh exit command is shorter than a reference time, wherein the control circuit comprises an oscillator duty cycle controller configured to select a period according to a mode register set command and comprising:
      a lookup table including a plurality of period settings, and
      a multiplexer configured to select one of the plurality of period setting values in response to a mode register set command to output the period; and
   a refresh controller configured to perform one of i) the self-refresh operation on a selected memory area of the cell array and ii) the skip of the self-refresh operation, in response to the control signal.

9. The semiconductor memory device of claim 8, wherein the control circuit further comprises:
   a duration detector configured to generate a clock signal according to the selected period and generate the control signal by comparing the time difference with the reference time based on the clock signal.

10. The semiconductor memory device of claim 9, wherein the duration detector comprises:
   an oscillator configured to generate the clock signal according to the selected period; and
   a counter configured to count elapsed time from the reception time of the self-refresh entry command based on the clock signal, and generate the control signal to skip the self-refresh operation when the self-refresh exit command is received before the elapsed time reaches the reference time.

11. The semiconductor memory device of claim 8, wherein the refresh controller performs all-bank refresh operation on a selected memory area in response to activation of the control signal.

12. The semiconductor memory device of claim 8, wherein the control circuit activates the control signal regardless of a length of the time difference according to a number of times a self-refresh operation is continuously skipped.

13. A self-refresh method of a semiconductor memory device, comprising:
   receiving a self-refresh entry command associated with a self-refresh operation;
   delaying the self-refresh operation by a reference time in response to the self-refresh entry command;
   detecting whether a self-refresh exit command is input before an elapsed time from receipt of the self-refresh entry command reaches a reference time;
   skipping the self-refresh operation when the self-refresh exit command is received before the elapsed time reaches the reference time; and
   counting a number of times the self-refresh operation is continuously skipped.

14. The method of claim 13, wherein the reference time is set based on a refresh period of the semiconductor memory device.

15. The method of claim 13, wherein the reference time is selected through a duty cycle adjustment of an internal oscillator set through a mode register set command.

16. The method of claim 13, further comprising:

executing the self-refresh operation if the self-refresh exit command is not received before the elapsed time reaches the reference time.

17. The method of claim 16, further comprising stopping the self-refresh operation in response to receipt of the self-refresh exit command.

18. The method of claim 13, further comprising performing the self-refresh operation regardless of a time difference between a reception time of the self-refresh entry command and a reception time of the self-refresh exit command when the counted number of times reaches a threshold number.

\* \* \* \* \*